(12) United States Patent
Cho

(10) Patent No.: US 10,650,715 B2
(45) Date of Patent: May 12, 2020

(54) SHORT CIRCUIT DETECTOR AND DISPLAY DEVICE HAVING THE SAME

(71) Applicant: Samsung Display Co., Ltd., Yongin-si (KR)

(72) Inventor: Seong Heon Cho, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 16/238,518

(22) Filed: Jan. 3, 2019

(65) Prior Publication Data

US 2019/0213936 A1 Jul. 11, 2019

(30) Foreign Application Priority Data

Jan. 5, 2018 (KR) .................. 10-2018-0001923

(51) Int. Cl.
*G09G 3/00* (2006.01)
*H01L 27/12* (2006.01)
*G09G 3/20* (2006.01)
*G01R 31/50* (2020.01)
G09G 3/3266 (2016.01)
G09G 3/36 (2006.01)
G09G 3/3275 (2016.01)

(52) U.S. Cl.
CPC ............. *G09G 3/006* (2013.01); *G01R 31/50* (2020.01); *G09G 3/20* (2013.01); *H01L 27/1244* (2013.01); G09G 3/3266 (2013.01); G09G 3/3275 (2013.01); G09G 3/3674 (2013.01); G09G 3/3685 (2013.01); G09G 2310/0267 (2013.01); G09G 2310/08 (2013.01); G09G 2330/12 (2013.01)

(58) Field of Classification Search
None
See application file for complete search history.

(56) References Cited

U.S. PATENT DOCUMENTS

| 6,853,364 | B2 | 2/2005 | Kai et al. | |
|---|---|---|---|---|
| 2005/0270059 | A1* | 12/2005 | Ando | G09G 3/006 324/760.01 |
| 2015/0116302 | A1* | 4/2015 | Kim | G09G 3/006 345/212 |
| 2017/0192326 | A1 | 7/2017 | Yu et al. | |

FOREIGN PATENT DOCUMENTS

JP 4562938 10/2010

* cited by examiner

*Primary Examiner* — Nicholas J Lee
(74) *Attorney, Agent, or Firm* — H.C. Park & Associates, PLC

(57) ABSTRACT

A short circuit detector includes a first transistor connected between a first portion of a data line and a second portion of the data line and including a gate electrode connected to a first node; a second transistor connected between a first voltage source and the first node and including a gate electrode configured to receive a short-circuit test signal; a third transistor connected between a second node included in the second portion and a third node and including a gate electrode configured to receive the short-circuit test signal; a fourth transistor connected between a second voltage source and the first node and including a gate electrode connected to the third node; and a fifth transistor connected to the first node and a third voltage source and including a gate electrode connected to the third node in common with the gate electrode of the third transistor.

19 Claims, 8 Drawing Sheets

SHORT CIRCUIT DETECTOR AND DISPLAY DEVICE HAVING THE SAME

CROSS REFERENCE TO RELATED APPLICATION

This application claims priority from and the benefit of Korean Patent Application No. 10-2018-0001923, filed on Jan. 5, 2018, which is hereby incorporated by reference for all purposes as if fully set forth herein.

BACKGROUND

Field

Exemplary embodiments of the inventive concepts relate to display devices. More particularly, exemplary embodiments of the inventive concepts relate to short circuit detectors for detecting line short circuits and display devices having the same.

Discussion of the Background

Pixels in a display device emit light at certain luminance level based on a magnitude of a data voltage supplied from a data driver. The data voltage is supplied to the pixels through a plurality of data lines.

In recent years, as display devices have increased in resolution, the degree of integration of pixels has been greatly increased. Therefore, various conductive lines and conductive patterns are now required to be concentrated in a narrow space. Accordingly, the probability of failure due to short-circuit of the conductive lines and/or patterns is increased.

For example, when a data line is short-circuited, a current overload condition is generated, which may damage driving circuits inside a display panel.

The above information disclosed in this Background section is only for understanding of the background of the inventive concepts, and, therefore, it may contain information that does not constitute prior art.

SUMMARY

Exemplary embodiments provide a short circuit detector for detecting short-circuit of data lines to interrupt the supply of a data voltage to corresponding pixels.

Exemplary embodiments also provide a display device having the short circuit detector.

Additional features of the inventive concepts will be set forth in the description which follows, and in part will be apparent from the description, or may be learned by practice of the inventive concepts.

An exemplary embodiment provides a display device may including a first transistor connected between a first portion of a data line and a second portion of the data line and including a gate electrode connected to a first node; a second transistor connected between a first voltage source and the first node and including a gate electrode to receive a short-circuit test signal; a third transistor connected between a second node included in the second portion of the data line and a third node and including a gate electrode to receive the short-circuit test signal; a fourth transistor connected between a second voltage source and the first node and including a gate electrode connected to the third node; and a fifth transistor connected to the first node and a third voltage source and including a gate electrode connected to the third node in common with the gate electrode of the third transistor.

The second transistor and the third transistor may be of different types having opposite states in response to the short-circuit test signal.

The third transistor may be turned on in an enable period of the short-circuit test signal. The second transistor may be in a turn-off state in the enable period of the short-circuit test signal.

Each of the first and second transistors may have a turn-on state in a disable period of the short-circuit test signal. The third transistor may have a turn-off state in the disable period of the short-circuit test signal.

A voltage of the first voltage source may correspond to a voltage level that is sufficient to turn on the first transistor.

The first portion and the second portion of the data line may be electrically connected to each other in the disable period of the short-circuit test signal.

The fourth transistor and the fifth transistor may be of different types having opposite states in response to a voltage of the third node.

The first transistor may be the same type as the fourth transistor.

The first transistor may be turned off and the data line is opened, when the fourth transistor is turned on.

A voltage of the second voltage source may correspond to a voltage level that is sufficient to turn off the first transistor.

The first transistor may be turned on and the first portion and the second portion of the data line may be electrically connected to each other, when the fifth transistor is turned on.

A voltage of the third voltage source may correspond to a voltage level that is sufficient to turn on the first transistor.

Another exemplary embodiment provides a display device including a display panel including a plurality of pixels connected to a plurality of scan lines and a plurality of data lines, respectively; a scan driver supplying a scan signal to each of the scan lines; a data driver supplying a data voltage to each of the data lines; a short circuit detector connecting a first portion and a second portion of a target data line among the data lines; and a timing controller controlling the scan driver, the data driver, and the short circuit detector. The short circuit detector detects a short circuit of the target data line based on a short-circuit test signal.

The short circuit detector may include a first transistor connected between the first portion of the target data line and the second portion of the target data line and including a gate electrode connected to a first node; a second transistor connected between a first voltage source and the first node and including a gate electrode to receive the short-circuit test signal; a third transistor connected between a second node included in the second portion of the target data line and a third node and including a gate electrode to receive the short-circuit test signal; a fourth transistor connected between a second voltage source and the first node and including a gate electrode connected to the third node; and a fifth transistor connected to the first node and a third voltage source and including a gate electrode connected to the third node in common with the gate electrode of the third transistor.

The target data lines may correspond to predetermined parts of the total data lines, and the short circuit detector may be connected to the target data lines.

The second transistor and the third transistor may be of different types having opposite states in response to the short-circuit test signal. The fourth transistor and the fifth transistor may be of different types having opposite states in response to a voltage of the third node. The first transistor and the fourth transistor may be of the same type.

The display panel may include a display area in which the pixels are arranged and a peripheral area in which the data driver and the scan driver are arranged outside the display area. The short circuit detector may be disposed between the display area and the data driver on the display panel.

The short circuit detector may be integrated in the data driver.

The short circuit detector may include a plurality of first transistors each connected between the first portion and the second portion of each of a plurality of target data lines and controlled in common based on a voltage of the first node; a second transistor connected between a first voltage source and the first node and including a gate electrode to turn on all the first transistors; a plurality of third transistors each connected between the second portion of the target data line and a common node and each including a gate electrode to receive the short-circuit test signal; a fourth transistor connected to a second voltage source and the first node and including a gate electrode connected to the common node; and a fifth transistor connected to the first node and a third voltage source and including a gate electrode connected to the third node in common with the gate electrode of the third transistor.

The second transistor may maintain a turn-off state and the third transistors may be sequentially turned on during a detection period in which a short-circuit detection is performed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
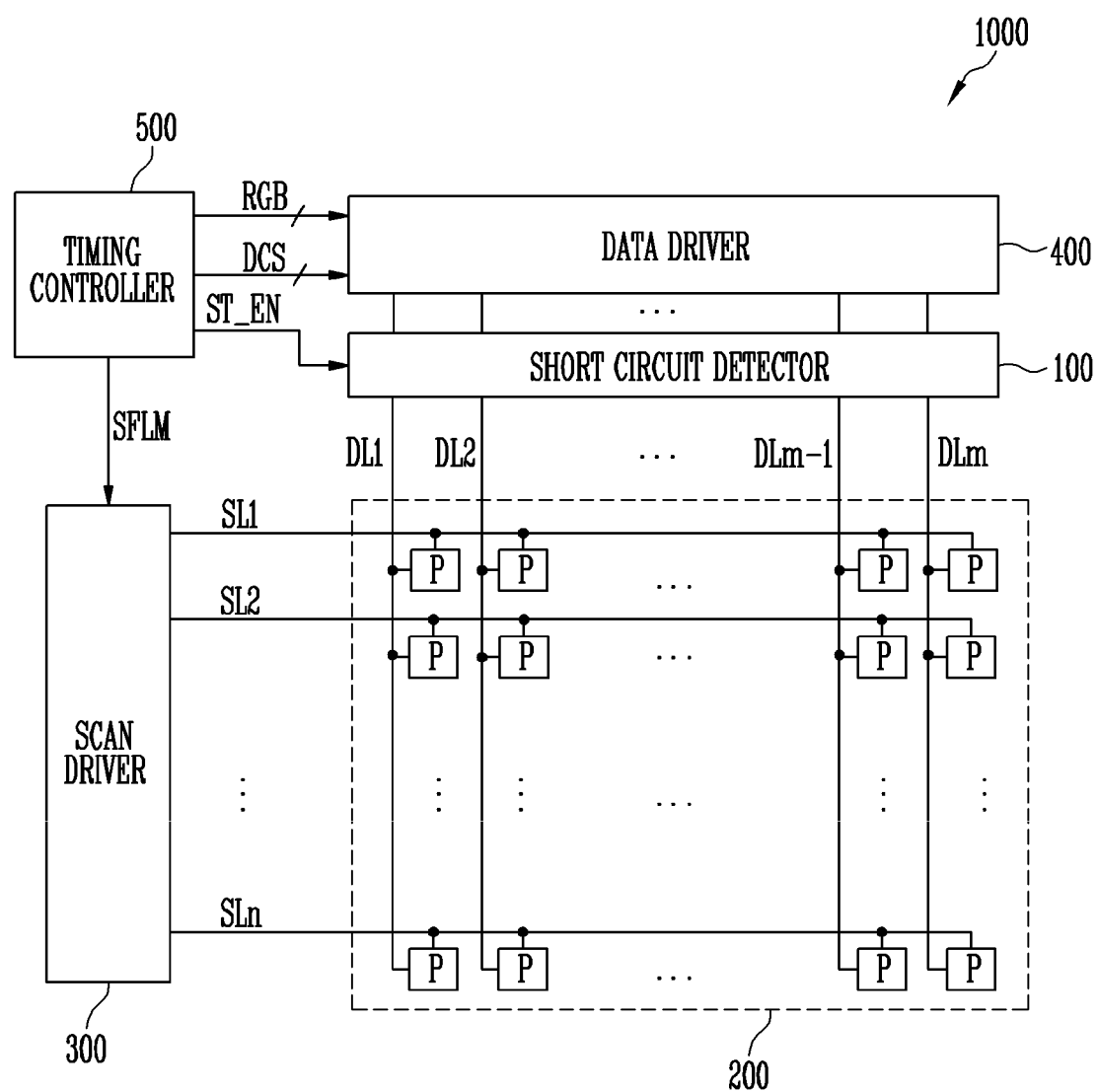
FIG. 1 is a block diagram of a display device according an exemplary embodiment of the inventive concepts.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

In the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram of a display device according to an exemplary embodiment.

Referring to FIG. 1, the display device 1000 may include a short circuit detector 100, a display panel 200, a scan driver 300, a data driver 400, and a timing controller 500.

The display device 1000 may be, for example, an organic light emitting display device, a liquid crystal display device, or another type of flat display device. The display device 1000 may be a flexible display device, a curved display device, a foldable display device, a bendable display device, or the like. Further, the display device 1000 may be used in a transparent display device, a head mount display device, a wearable display device, or the like.

The display panel 200 includes a plurality of scan lines SL1 to SLn, a plurality of data lines DL1 to DLm, and a plurality of pixels P coupled to respective scan lines SL1 to SLn and the respective data lines DL1 to DLm, where n and m are integers of 1 or more. The pixels P may be arranged in a matrix form in a display area of the display panel 200.

The scan driver 300, the data driver 400, and the timing controller 500 are disposed in a peripheral area outside the display area of the display panel 200.

The scan driver 300 applies scan signals to the scan lines SL1 to SLn in response to a scan control signal SFLM provided from the timing controller 500. In some exemplary embodiments, the scan driver 300 may be integrated on the peripheral area or mounted on the peripheral area in a form of a driver chip.

The data driver 400 applies data voltages to the data lines DL1 to DLm based on a data control signal DCS and image data RGB provided from the timing controller 500. The data driver 400 may be integrated on a printed circuit film (e.g., a flexible printed circuit film: FPC) attached to (mounted on) the peripheral area of the display panel 200 or may be directly disposed on the peripheral area.

The short circuit detector 100 connects a first portion and a second portion of a target data line among the data lines DL1 to DLm. The short circuit detector 100 detects a short circuit of the target data line based on a short-circuit test signal ST_EN. When it is determined that the target data line is short-circuited, the short circuit detector 100 floats the target data line and blocks the electrical connection between the target data line and the pixels P corresponding thereto. The target data line may be a specific data line coupled to the short circuit detector 100 among the data lines DL1 to DLm. For example, when the short circuit detector 100 is connected to each of the entire data lines DL1 to DLm, the entire data lines DL1 to DLm may correspond to the target data lines. However, this example is for illustrative purposes only, and the target data line may correspond to only a part of the data lines DL1 to DLm. For example, target data lines may correspond to some data lines arranged at predetermined intervals among the entirety of the data lines.

In some exemplary embodiments, each short circuit detector 100 may be connected to each of the target data lines. Individual data voltage supply cutoff may be allowed for each of the target data lines.

In some exemplary embodiments, a plurality of target data lines may share some configuration of the short circuit detectors. A space occupied by the short circuit detectors in the display panel 200 may be reduced.

In some exemplary embodiments, the short-circuit test signal ST_EN may be disabled (or inactivated) during an image display period in which the display panel 200 displays an image. The first portion and the second portion of each of the target data lines may be electrically connected to each other in the image display period. Thus, the data voltage may be supplied to the pixels P.

The short circuit of the target data lines is detected using the data voltage output from the data driver 400 in a detection period for detecting the short-circuit of the target data lines. When it is determined that the target data line is short-circuited, the short circuit detector 100 floats the target data line and blocks (cuts off) the electrical connection between the target data line and the pixels P corresponding thereto.

In some exemplary embodiments, the short-circuit test signal ST_EN may be supplied through the timing controller 500 or an external control block.

In some exemplary embodiments, the short circuit detector 100 may be disposed at the peripheral area between the display area and the data driver 400 on the display panel 200.

In some exemplary embodiments, the short circuit detector 100 may be integrated in the data driver 400. For example, the short circuit detector 100 may be coupled to output terminals of the data driver 400 therein.

Exemplary embodiments of elements and operations of the short circuit detector 100 will be described in detail with reference to FIGS. 2 to 11.

The timing controller 500 receives RGB image signals, a vertical synchronization (SYNC) signal, a horizontal SYNC signal, a main clock signal, a data enable signal, etc. from an external graphics controller (not illustrated), and generates, based on the received signals, the short-circuit test signal ST_EN, the scan control signal SFLM, the data control signal DCS, and the image data RGB corresponding to the input RGB image signals. The timing controller 500 provides the scan control signal SFLM to the scan driver 300; provides both the image data RGB and the data control signal DCS to the data driver 400; and provides the short-circuit test signal ST_EN to the short circuit detector 100. In some exemplary embodiments, the timing controller 500 may be integrated in a single driver chip with the data driver 400.

As described above, the display device 1000 according to exemplary embodiments may include the short circuit detector 100 for detecting a fault, such as short-circuiting of the data lines DL1 to DLm and cutting off of the electrical connection between the target data line and the pixels P. Thus, damages and failures of the display panel 200 due to the short circuit and resulting current overload can be prevented.

Figure 2:
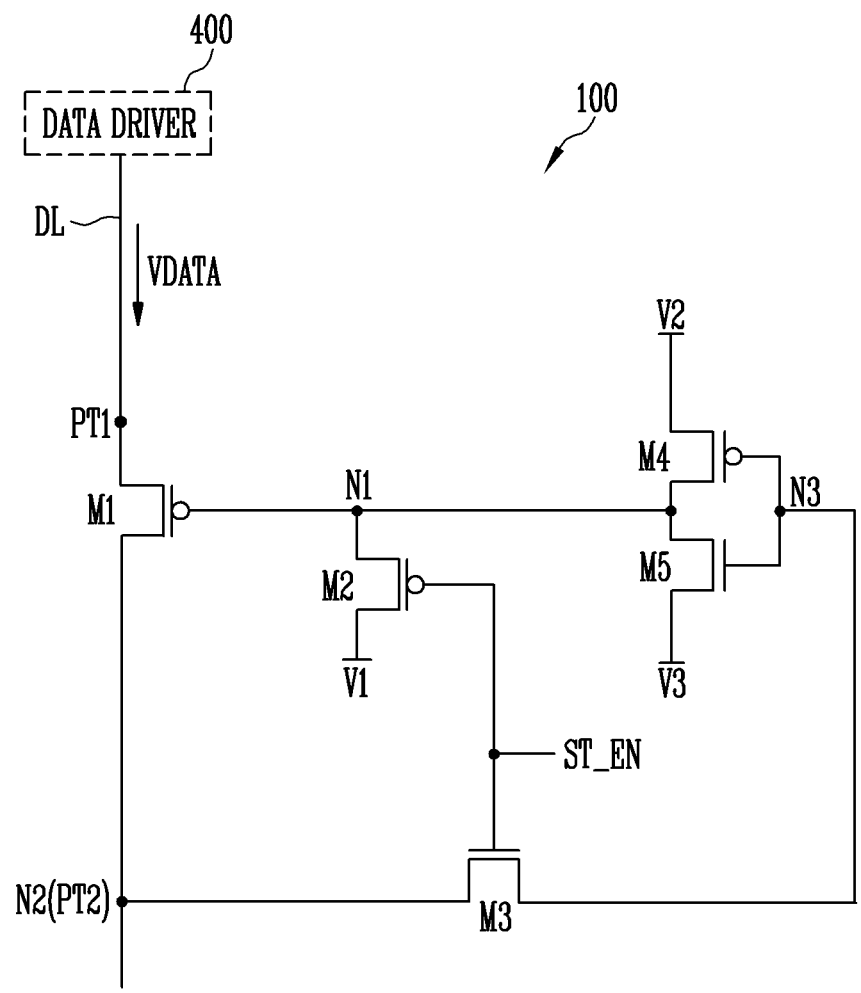
FIG. 2 is a circuit diagram of a short circuit detector according to an exemplary embodiment of the inventive concepts.

FIG. 2 is a circuit diagram of a short circuit detector according to an exemplary embodiments.

Referring to FIG. 2, the short circuit detector 100 includes a first transistor M1, a second transistor M2, a third transistor M3, a fourth transistor M4, and a fifth transistor M5.

In some exemplary embodiments, the first to fifth transistors M1 to M5 may be implemented as one of thin film transistors, such as an oxide thin film transistor, a low temperature poly-silicon (LTPS) thin film transistor, and a low temperature polycrystalline oxide (LTPO) transistor.

The first transistor M1 connects a first portion PT1 of a data line DL (e.g., a target data line) to a second portion PT2 of the data line DL. For example, a first electrode (e.g., a source electrode) of the first transistor M1 is connected to the first portion PT1 of the data line DL and a second electrode (e.g., a drain electrode) of the first transistor M1 is connected to the second portion PT2 of the data line DL.

The first transistor M1 includes a gate electrode connected to a first node N1. One of a voltage of a first voltage source V1, a voltage of a second voltage source V2, a voltage of a third voltage source V3 is supplied to the gate electrode of the first transistor M1 to control the switching of the first transistor M1.

The first transistor M1 transfers a data voltage VDATA supplied from the data driver 400 to a second node N2 or block (cut off) the supply of the data voltage VDATA. The connection between the first portion PT1 and the second portion PT2 of the data line DL is broken when the first transistor M1 is turned off, thereby blocking the supply of the data voltage VDATA.

The second transistor M2 is connected between the first voltage source V1 and the first node N1. For example, a first electrode of the second transistor M2 may be connected to the first voltage source V1 and a second electrode of the second transistor M2 may be connected to the first node N1.

The second transistor M2 includes a gate electrode receiving the short-circuit test signal ST_EN. The second transistor M2 transfers the voltage of the first voltage source V1 to the first node N1 based on a level of the short-circuit test signal ST_EN. In some exemplary embodiments, the first voltage source V1 may output a DC voltage and the voltage level of the first voltage source V1 may correspond to a voltage level that is sufficient to turn on the first transistor M1. For example, when the first transistor M1 is a P-channel metal oxide semiconductor (PMOS) transistor, the voltage of the first voltage source V1 may be low enough to turn on the PMOS transistor completely. For example, the second transistor M2 may be the PMOS transistor, and the first voltage source may correspond to an initialization voltage source for initializing a driving transistor in the pixel.

When the second transistor M2 is turned on, the first transistor M1 is turned on and the data voltage VDATA may be supplied to the second node N2.

The third transistor M3 is connected between the second node N2 included in the data line DL and a third node N3. For example, a first electrode of the third transistor M3 may be connected to the second node N2 and a second electrode of the third transistor M3 may be connected to the third node N3.

The third transistor M3 includes a gate electrode receiving the short-circuit test signal ST_EN. The third transistor M3 transfers a voltage of the second node N2 (e.g., the data voltage VDATA) to the third node N3 based on the level of the short-circuit test signal ST_EN. In some exemplary embodiments, the data voltage VDATA may have a value of about 2V to about 6.5V. For example, the data voltage VDATA corresponding to a black image may be about 6.5V, and the data voltage VDATA corresponding to a white image may be about 2V. However, these examples are for illustrative purposes only, and the range of the data voltage VDATA is not limited thereto. For example, the range of the data voltage VDATA may have a negative voltage range.

When the data line DL is not short-circuited, the data voltage VDATA is transferred to the third node N3 without a considerable change. However, when the data line DL is short-circuited, the voltage of the second node N2 and the voltage of the third node N3 drops to ground level.

The second transistor M2 and the third transistor M3 are commonly controlled by the short-circuit test signal ST_EN. That is, the second transistor M2 and the third transistor M3 are different types having opposite states in response to the short-circuit test signal ST_EN. For example, the second transistor M2 may be a PMOS transistor, and the third transistor M3 may be an N-channel metal oxide semiconductor (NMOS) transistor. Accordingly, the third transistor M3 has a turn-off state when the second transistor M2 is turned on. The second transistor M2 has a turn-off state when the third transistor M3 is turned on.

Since these examples are for illustrative purpose only, the types of the second and third transistors are not limited thereto. For example, the second transistor M2 may be the NMOS transistor and the third transistor M3 may be the PMOS transistor. The second and third transistors M2 and M3 may be transistors of the same type. In this example, control signals of opposite waveforms may be applied to the respective gate electrodes.

The fourth transistor M4 is connected between the second voltage source V2 and the first node N1. For example, a first electrode of the fourth transistor M4 may be connected to the second voltage source V2, and a second electrode of the fourth transistor M4 may be connected to the first node N1.

The fourth transistor M4 includes a gate electrode connected to the third node N3. The fourth transistor M4 transfers a voltage of the second voltage source V2 to the first node N1, that is, the gate electrode of the first transistor M1, based on the voltage of the third node N3. In some exemplary embodiments, the second voltage source V2 may output a DC voltage, and a voltage level of the second voltage source V2 may correspond to a voltage capable of fully turning off the first transistor M1. For example, if the first transistor M1 is a PMOS transistor, the second voltage source V2 is a voltage high enough to turn the PMOS transistor completely off. For example, the first and fourth transistors M1 and M4 may be PMOS transistors and the second voltage source V2 may correspond to a driving voltage (e.g., ELVDD voltage, about 5V) source provided to the pixel.

When the fourth transistor M4 is turned on, the first transistor M1 is turned off so that the supply of the data voltage VDATA to the pixel may be interrupted.

The fifth transistor M5 is connected between the first node N1 and the third voltage source V3. For example, a first electrode of the fifth transistor M5 may be connected to the third voltage source V3, and a second electrode of the fifth transistor M5 may be connected to the first node N1.

The fifth transistor M5 includes a gate electrode connected to the third node N3. That is, the gate electrode of the fifth transistor M5 and the gate electrode of the fourth transistor M4 are commonly connected to the third node N3 and are commonly controlled by the voltage of the third node N3.

The fifth transistor M5 transfers the voltage of the third voltage source V3 to the first node N1, that is, the gate electrode of the first transistor M1, based on the voltage of the third node N3. In some exemplary embodiments, the third voltage source V3 may output a DC voltage, and a voltage level of the third voltage source V3 may correspond to a voltage capable of fully turning on the first transistor M1. For example, when the first transistor M1 is a PMOS transistor, the third voltage source V3 may be a voltage low enough to turn the PMOS transistor completely off. For example, the fifth transistor M5 may be an NMOS transistor and the third voltage source V3 may correspond to a ground level.

When the fifth transistor M5 is turned on, the first transistor M1 is turned on to supply the data voltage VDATA to the pixel and/or the data voltage VDATA to the third node N3 through the second node N2.

The fourth transistor M4 and the fifth transistor M5 are commonly controlled by the voltage of the third node N3. That is, the fourth transistor M4 and the fifth transistor M5 may be of different types having opposite states in response to the voltage of the third node N3. For example, the fourth transistor M4 may be a PMOS transistor, and the fifth transistor M5 may be an NMOS transistor. Accordingly, the fifth transistor M5 has a turn-off state when the fourth transistor M4 is turned on. The fourth transistor M4 has a turn-off state when the fifth transistor M5 is turned on.

Since these examples are for illustrative purposes only, the types of the fourth and fifth transistors M4 and M5 are not limited thereto. For example, the fourth transistor M4 may be an NMOS transistor, and the fifth transistor M5 may be a PMOS transistor.

In some exemplary embodiments, the first and fourth transistors M1 and M4 may be transistors having the same type.

As described above, the short circuit detector 100 according to exemplary embodiments may detect defects, such as short-circuiting of the data lines, and disconnect an electrical connection with respect to the short-circuited data lines by a simple transistor connection configuration and a simple control method using the short-circuit test signal ST_EN. Therefore, it is possible to prevent damage to the display panel, a complete display failure, and/or other malfunctions of the display device due to the occurrence of a current overload by use of a relatively simple short circuit detector structure with a small cost burden.

Figure 3:
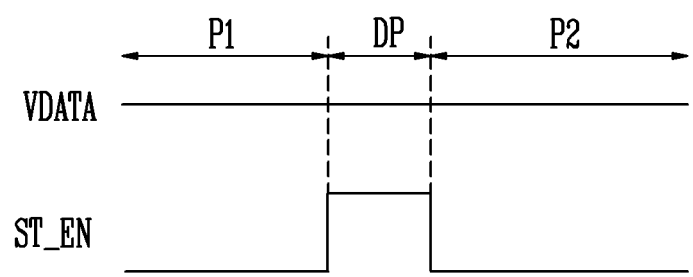
FIG. 3 is a timing diagram illustrating an example of a short-circuit test signal provided to the short circuit detector of FIG. 2.
Figure 4A:
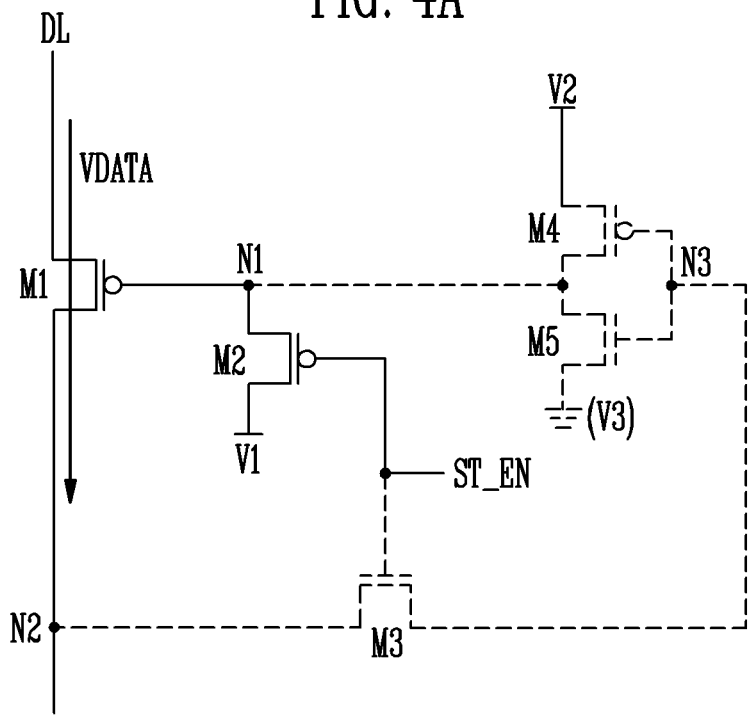
FIG. 4A, FIG. 4B, and FIG. 4C are diagrams illustrating examples of an operation of the short circuit detector of FIG. 3.
Figure 4B:
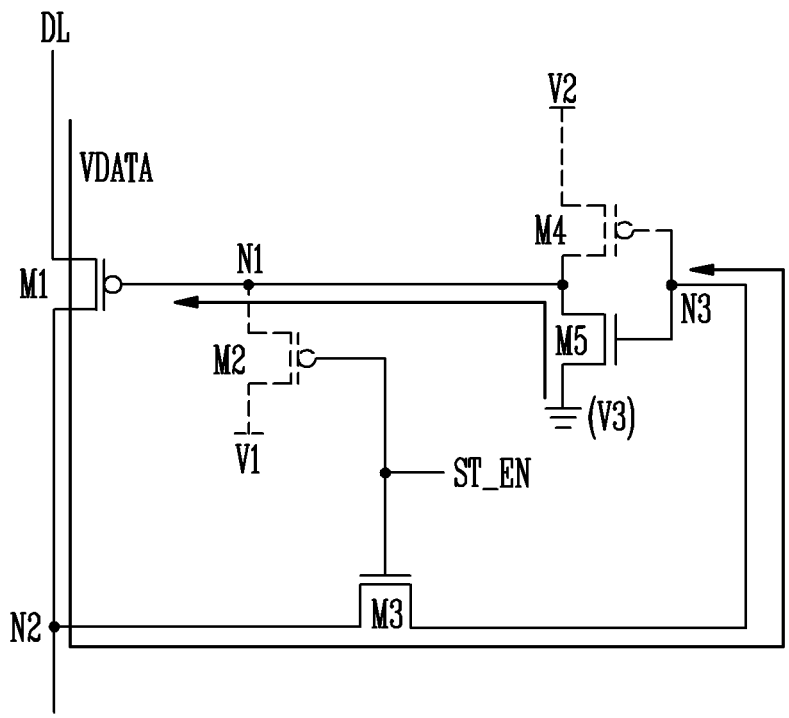
Figure 4C:
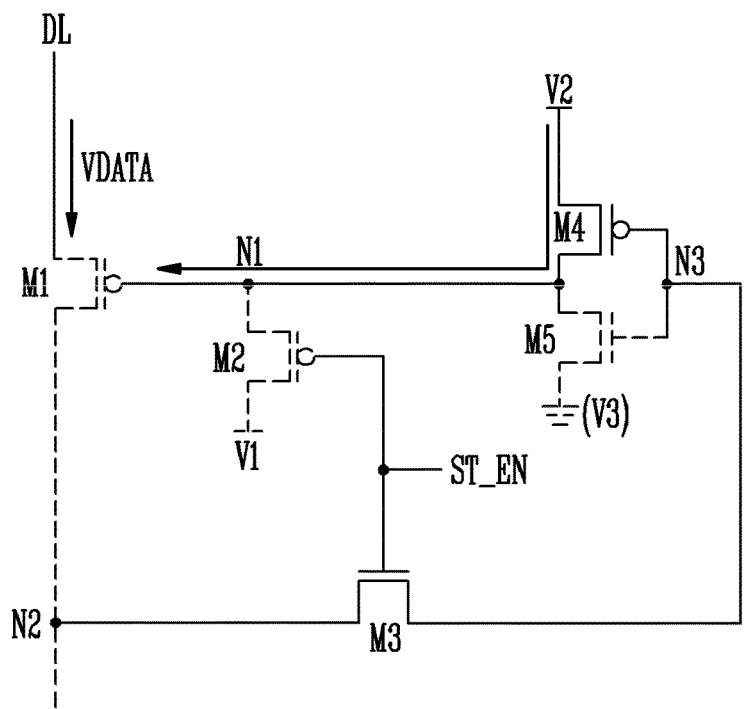

FIG. 3 is a timing diagram illustrating an example of a short-circuit test signal provided to the short circuit detector of FIG. 2. FIGS. 4A to 4C are diagrams illustrating examples of an operation of the short circuit detector of FIG. 3.

Referring to FIGS. 2 to 4C, the short circuit detector 100 performs a short-circuit detection with respect the data line DL in response to the short-circuit test signal ST_EN.

In some exemplary embodiments, the first transistor M1, the second transistor M2, and the fourth transistor M4 may be PMOS transistors, and the third transistor M3 and the fifth transistor M5 may be NMOS transistors. The short-circuit test signal ST_EN is enabled during a detection period DP. For example, the short-circuit test signal ST_EN may have a logic high level during the detection period DP and may have a logic low level during the other periods (for example, periods P1 and P2).

The enable period of the short-circuit test signal ST_EN corresponds to the detection period DP, and the disable period of the short-circuit test signal ST_EN corresponds to display driving periods P1 and P2. A short-circuit detection for the data line DL is performed during the detection period DP.

The short circuit test signal ST_EN is output at a logic low level during a first period P1, which is the display driving period before the detection period DP. FIG. 4A shows an operation of the short circuit detector 100 in the first period P1. As illustrated in FIG. 4A, the second transistor M2 is turned on and the third transistor M3 may be turned off in response to the short-circuit test signal ST_EN at a logic low level.

The voltage of the first voltage source V1 is supplied to the gate electrode of the first transistor M1 through the turned-on second transistor M2, so that the first transistor M1 is turned on. Here, the first voltage source V1 may be a voltage low enough to completely turn on the first transistor M1. Accordingly, the data voltage VDATA is supplied to the pixel via the data line DL.

Thereafter, the short-circuit test signal ST_EN is enabled to have a logic high level during the detection period DP. FIG. 4B shows an operation of the short circuit detector 100 in the detection period DP. Specifically, FIG. 4B shows an operation of the short circuit detector 100 when the data line DL is normally connected.

As illustrated in FIG. 4B, the third transistor M3 is turned on and the second transistor M2 is turned off, in response to the short-circuit test signal ST_EN of a logic low level in the state that the first transistor M1 is turned on.

The data voltage VDATA is supplied to the third node N3 through the turned-on third transistor M3. When the normal data voltage VDATA is transferred to the third node N3, the fifth transistor M5 is turned on and the fourth transistor M4 is turned off. Therefore, the voltage of the third voltage source V3 is supplied to the gate electrode of the first transistor M1, and the first transistor M1 is maintained in the turn-on state. The third voltage source V3 is a voltage low enough to completely turn on the first transistor M1. For example, the third voltage source V3 may be the ground voltage or may be substantially the same as the first voltage source V1.

The short circuit detector 100 determines that the data line DL is normally connected. Accordingly, the data voltage VDATA is supplied to the pixel through the data line DL in the second period P2, which is the display driving period.

FIG. 4C shows another operation of the short circuit detector 100 in the detection period DP. Specifically, FIG. 4C shows the operation of the short circuit detector 100 when the data line DL is short-circuited to another wiring.

When the data line DL is short-circuited, the voltage transferred to the third node N3 through the second node N2 is changed to ground level. Thus, as shown in FIG. 4C, the fourth transistor M4, which is a PMOS transistor, is turned on and the fifth transistor M5, which is an NMOS transistor, is turned off. Accordingly, the voltage of the second voltage source V2 is supplied to the gate electrode of the first transistor M1, and the first transistor M1 is turned off. The voltage output from the second voltage source V2 is high enough to turn off the first transistor M1 completely. For example, the second voltage source V2 may be a high potential driving voltage (e.g., an ELVDD voltage) for the pixel. Thereby, the electrical connection between the first portion PT1 and the second portion PT2 of the data line DL may be cut off, and the supply of the data voltage VDATA to the pixel may be interrupted.

The short circuit detector 100 may determine that the data line DL is short-circuited. Accordingly, the data line DL may be floated in the following display driving period, and the supply of the data voltage VDATA to the pixel may be interrupted.

As described above, the short circuit detector 100 according to exemplary embodiments may detect defects, such as short-circuiting of the data lines, and disconnect electrical connection with respect to the short-circuited data lines, by a simple transistor connection configuration and a simple control method using the short-circuit test signal ST_EN. Therefore, it is possible to prevent damages of the display panel, display failure, and/or complete malfunction of the display device due to the occurrence of current overload by a relatively simple short circuit detector structure with a small cost burden.

Figure 5:
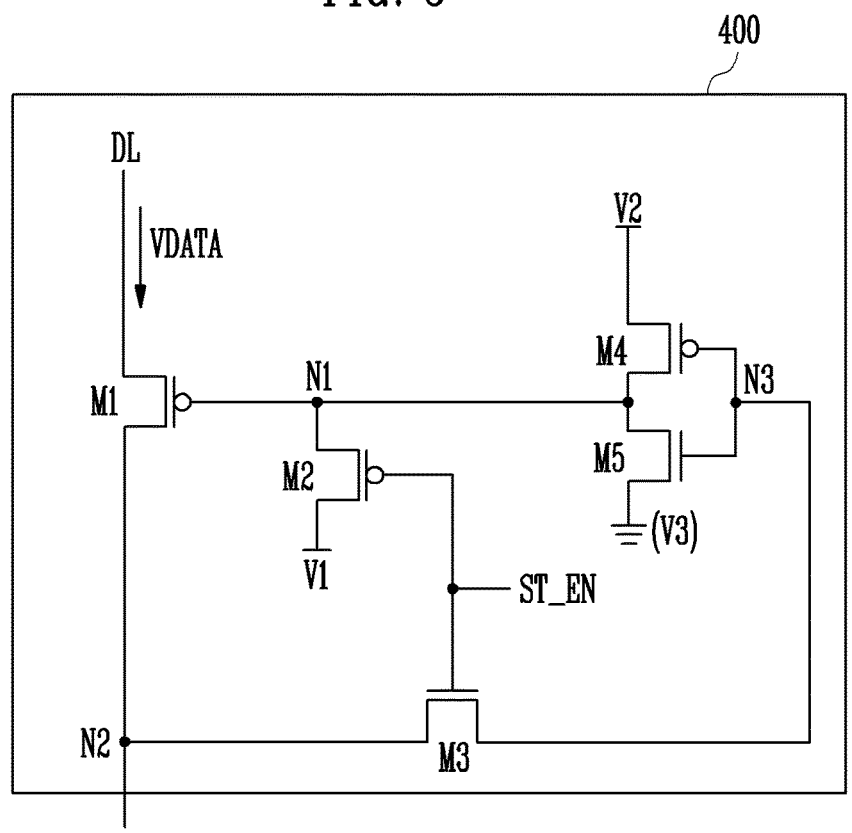
FIG. 5 is a diagram illustrating an example of an arrangement of the short circuit detector of FIG. 2.

FIG. 5 is a diagram illustrating an example of an arrangement of the short circuit detector of FIG. 2.

The short circuit detector of the present exemplary embodiments is substantially the same as the short circuit detector explained with reference to FIG. 2 except for configuration design of the short circuit detector. Thus, the same reference numerals will be used to refer to the same or like parts as those described in the exemplary embodiments of FIG. 2, and any repetitive explanation concerning the above elements will be omitted.

Referring to FIGS. 2 and 5, the short circuit detector 100 includes the first to fifth transistors M1 to M5.

In some exemplary embodiments, the short circuit detector 100 may be disposed inside the data driver 400. For example, the data driver 400 may be integrated in a driver chip in a form of an integrated circuit (IC). The short circuit detector 100 may be integrated in the driver chip with the data driver 400. For example, the first transistor M1 in the short circuit detector 100 may connect a part of an output terminal of the data driver 400 in the driver chip to a fan-out unit of a display panel.

Accordingly, the short circuit detector 100 does not occupy a dead space of the display panel, so that the dead space may be reduced. Alternatively, another structure for driving the display panel may be substituted in the dead space between the data driver and a display area.

Figure 6:
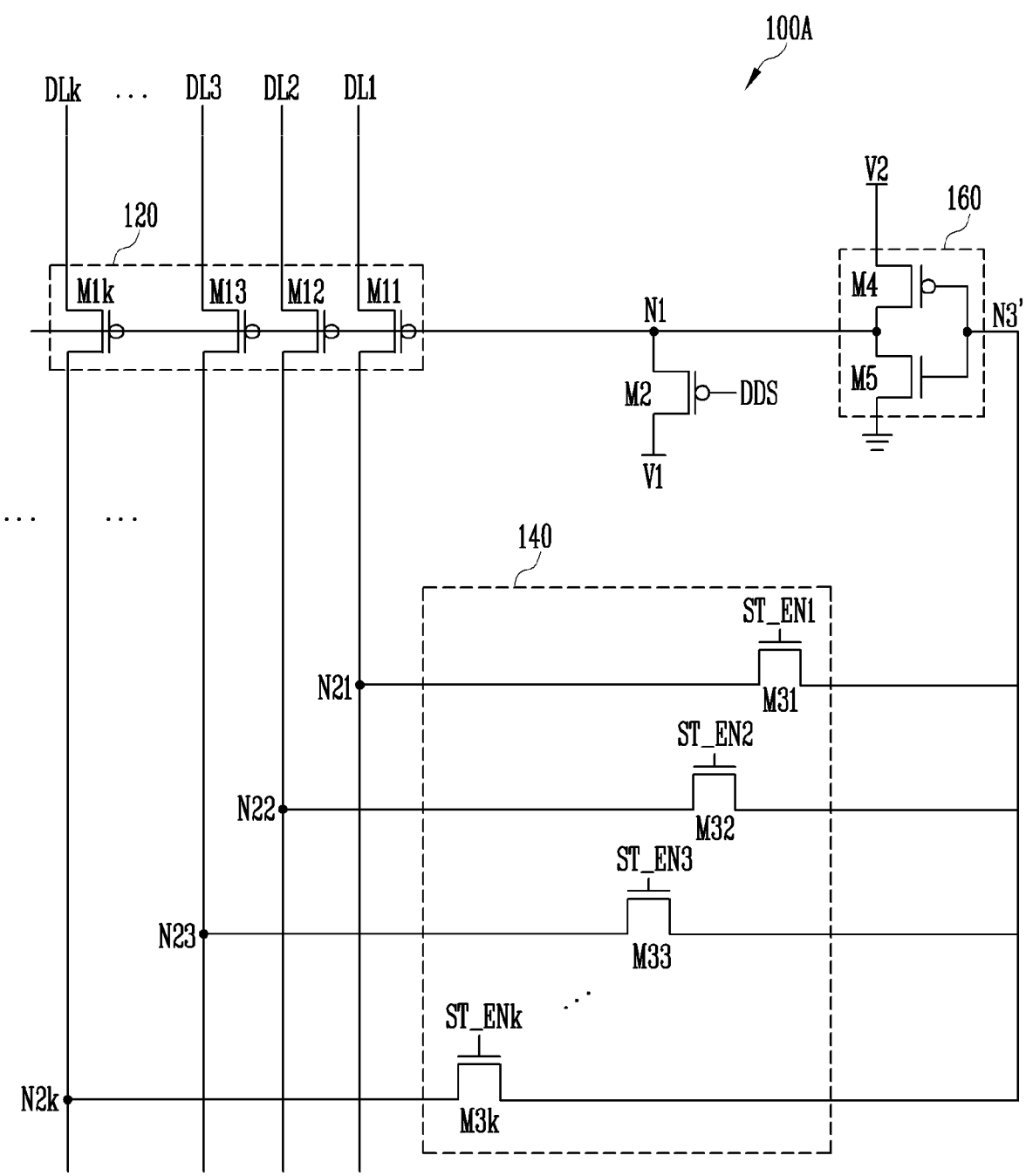
FIG. 6 is a circuit diagram of a short circuit detector according to an exemplary embodiment of the inventive concepts.
Figure 7:
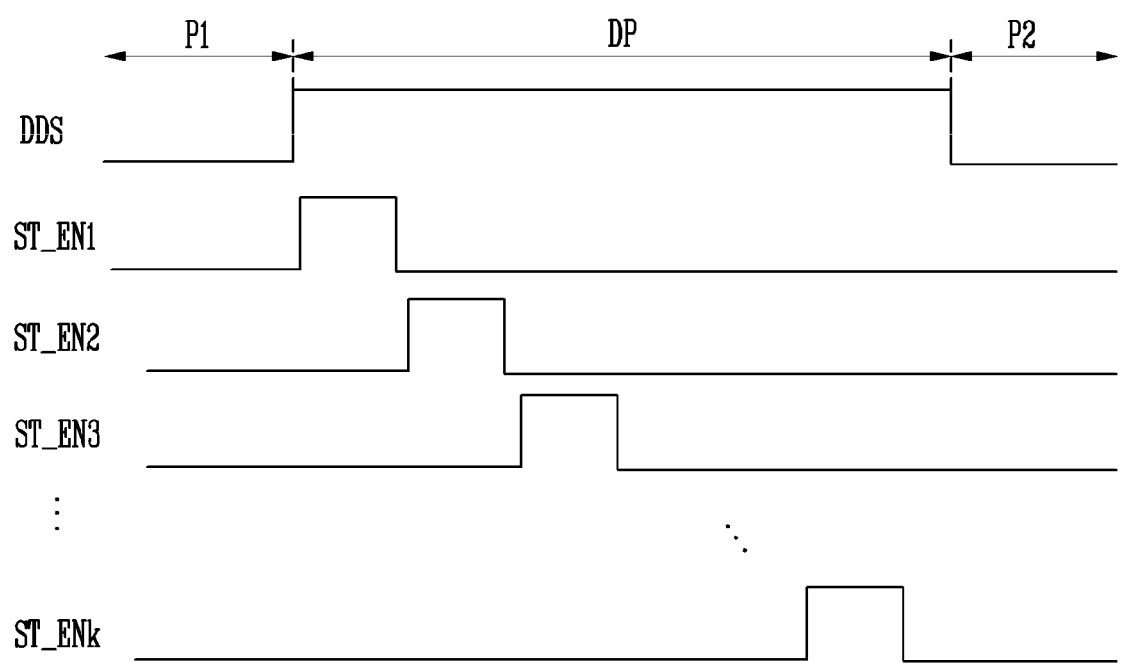
FIG. 7 is a timing diagram illustrating an example of a short-circuit test signal provided to the short circuit detector of FIG. 6.

FIG. 6 is a circuit diagram of a short circuit detector according to exemplary embodiments. FIG. 7 is a timing diagram illustrating an example of a short-circuit test signal provided to the short circuit detector of FIG. 6.

The short circuit detector of the present exemplary embodiments is substantially the same as the short circuit detector explained with reference to FIG. 2 except for configurations of first transistors and third transistors. Thus, the same reference numerals will be used to refer to the same or like parts as those described in the example embodiments of FIG. 2, and any repetitive explanation concerning the above elements will be omitted.

Referring to FIGS. 6 and 7, a short circuit detector 100A may include a plurality of first transistors M11 to M1$k$ (120), the second transistor M2, a plurality of third transistors M31 to M3$k$ (140), and the fifth transistor M5 to perform short-circuit detection on a plurality of target data lines DL1 to DL$k$, where k is an integer greater than 1.

The second transistor M2, the fourth transistor M4, and the fifth transistor M5 are commonly used for performing the short-circuit detection for the plurality of data lines DL1 to DL$k$.

The first transistors M11 to M1$k$ connect a first portion and a second portion of each of the plurality of data lines DL1 to DL$k$ corresponding thereto. Gate electrodes of the first transistors M11 to M1$k$ are commonly connected to the first node N1. Therefore, the first transistors M11 to M1$k$ are commonly controlled by a voltage of the first node N1. For example, the first transistors M11 to M1$k$ may be a data line controller 120 for commonly controlling the connection states of the target data lines DL1 to DL$k$.

As illustrated in FIG. 7, since a display drive signal DDS is provided to the PMOS transistor, the display drive signal DDS has a logic low level in the display driving periods P1 and P2 and a logic high level in the detection period DP. Accordingly, the first transistors M11 to M1$k$ are turned on in the display driving periods P1 and P2, and are turned off in the detection period DP.

The second transistor M2 is connected between the first voltage source V1 and the first node N1. The second transistor M2 includes a gate electrode for receiving the display drive signal DDS. The second transistor M2 transfers a voltage of the first voltage source V1 to the first node N1 based on the level of the short-circuit test signal ST_EN. The display drive signal DDS is a voltage for turning on the second transistor M2 to supply the voltage of the first voltage source V1 to the first node N1.

Each of the third transistors M31 to M3k is connected between the second node N21 to N2k included in the second portion of each of corresponding target data lines DL1 and a common node N3'. The gate electrodes of the third transistors M31 to M3k receive the first to k-th short-circuit test signals ST_EN1 to ST_ENk, respectively. The first to k-th short-circuit test signals ST_EN1 to ST_ENk are either simultaneously enabled or sequentially enabled.

In some exemplary embodiments, as illustrated in FIG. 7, the first to k-th short-circuit test signals ST_EN1 to ST_ENk supplied to the NMOS transistors may be sequentially enabled in the detection period DP. Accordingly, the short-circuit detection for the target data lines DL1 to DLk may be sequentially performed. That is, during the detection period DP, the second transistor M2 may maintain the turn-off state and the third transistors M21 to M3k may be sequentially turned on.

The data voltages supplied to the respective target data lines DL1 to DLk are transferred to the common node N3' by turning on the third transistors M31 to M3k. As a result, the third transistors M31 to M3k function as a connector 140 for transferring the data voltage to the common node N3'.

The fourth and fifth transistors M4 and M5 function as a detector 160 for detecting whether or not the target data lines DL1 to DLk are short-circuited. The single detector 160 is commonly used for the plurality of target data lines DL1 to DLk. When at least one of the target data lines DL1 to DLk is short-circuited, the fourth transistor M4 is turned on and all the first transistors M11 to M1k included in the data line controller 120 are turned off.

As described above, since the second, fourth, and fifth transistors M2, M4, and M5 are commonly used for short-circuit detection of a plurality of data lines, the space occupied by the short circuit detector 100A may be reduced.

Figure 8:
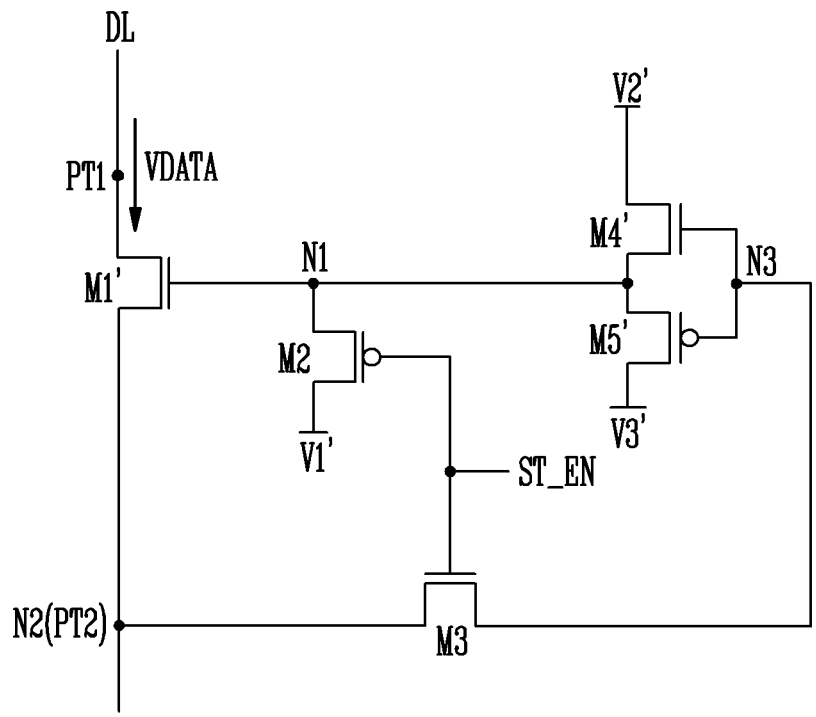
FIG. 8 is a circuit diagram illustrating an example of the short circuit detector of FIG. 2.

FIG. 8 is a circuit diagram illustrating an example of the short circuit detector of FIG. 2.

The short circuit detector of the present exemplary embodiment is substantially the same as the short circuit detector explained with reference to FIG. 2 except for configurations of first, fourth, and fifth transistors. Thus, the same reference numerals will be used to refer to the same or like parts as those described in the exemplary embodiment of FIG. 2, and any repetitive explanation concerning the above elements will be omitted.

Referring to FIG. 8, the short circuit detector includes a first transistor M1', the second transistor M2, the third transistor M3, a fourth transistor M4', and a fifth transistor M5'.

In some exemplary embodiments, the second transistor M2 and the third transistor M3 may be of different types having opposite states in response to the short-circuit test signal ST_EN. The fourth transistor M4' and the fifth transistor M5' may be of different types having opposite states in response to a voltage of the third node N3. The first transistor M1' and the fourth transistor M4' may be of the same type. For example, the first, third, and fourth transistors M1', M3, and M4' may be NMOS transistors, and the second and fifth transistors M2 and M5' may be PMOS transistors.

The first transistor M1' connects the first portion PT1 of the data line (target data line) DL to the second portion PT2 of the data line DL. The first transistor M1' includes a gate electrode connected to the first node N1. The first transistor M1' is turned on based on a voltage of the first voltage source V1' or a voltage of the second voltage source V2'. The first transistor M1' is turned off based on a voltage of the third voltage source V3'.

The second transistor M2 is connected between the first voltage source V1' and the first node N1. The second transistor M2 includes a gate electrode receiving the short-circuit test signal ST_EN. In some exemplary embodiments, the first voltage source V1' may output a DC voltage and the voltage level of the first voltage source V1' may correspond to a voltage level that is sufficient to turn on the first transistor M1. For example, the voltage of the first voltage source V1' may be high enough to turn on the NMOS transistor completely, e.g., a driving voltage (ELVDD) of the pixel.

The third transistor M3 is connected between the second node N2 included in the data line DL and a third node N3. The third transistor M3 includes a gate electrode receiving the short-circuit test signal ST_EN.

The fourth transistor M4' is connected between the second voltage source V2' and the first node N1. The fourth transistor M4' includes a gate electrode connected to the third node N3. The fourth transistor M4' transfers a voltage of the second voltage source V2' to the first node N1, that is, the gate electrode of the first transistor M1', based on the voltage of the third node N3. In some exemplary embodiments, the fourth transistor M4' may be turned on when the data line DL is normally connected. Thus, when the fourth transistor M4' is turned on, the first transistor M1' has to maintain the turn-on state.

In some exemplary embodiments, the second voltage source V2' may output a DC voltage, and a voltage level of the second voltage source V2' may correspond to a voltage capable of fully turning on the first transistor M1'. For example, the voltage output from the second voltage source V2' may be high enough to completely turn on the first transistor M1'. For example, the second voltage source V2' may a high potential driving voltage (e.g., an ELVDD voltage) for the pixel.

The fifth transistor M5' is connected between the first node N1 and the third voltage source V3'. The fifth transistor M5' includes a gate electrode connected to the third node N3. That is, the gate electrode of the fifth transistor M5' and the gate electrode of the fourth transistor M4' are commonly connected to the third node N3 and are commonly controlled by the voltage of the third node N3.

The fifth transistor M5' transfers the voltage of the third voltage source V3' to the first node N1, that is, the gate electrode of the first transistor M1', based on the voltage of the third node N3. In some exemplary embodiments, the third voltage source V3' may output a DC voltage, and the voltage level of the third voltage source V3' may correspond to a voltage capable of fully turning off the first transistor M1'. Accordingly, when the data line DL is short-circuited, the fifth transistor M5' has to be turned on and the first transistor M1' has to be turned off. Thus, the voltage level of the third voltage source V3' is low enough to completely turn off the first transistor M1'. For example, the third voltage source V2' may be at ground level.

Figure 9:
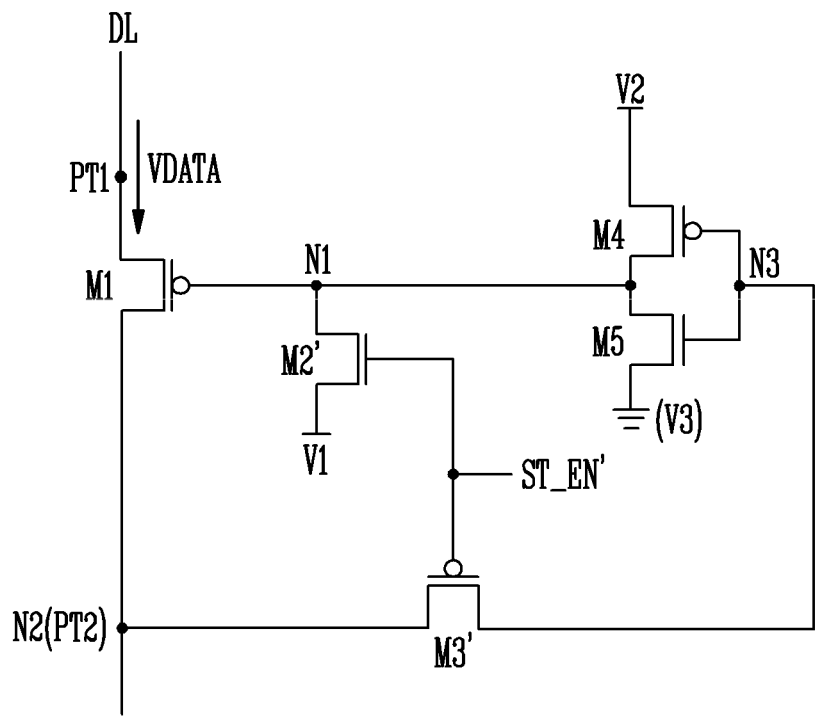
FIG. 9 is a circuit diagram illustrating an example of the short circuit detector of FIG. 2.

FIG. 9 is a circuit diagram illustrating an example of the short circuit detector of FIG. 2.

The short circuit detector of the present exemplary embodiment is substantially the same as the short circuit detector explained with reference to FIG. 2 except for configurations of second and third transistors. Thus, the same reference numerals will be used to refer to the same or like parts as those described in the exemplary embodiments of FIG. 2, and any repetitive explanation concerning the above elements will be omitted.

Referring to FIG. 9, the short circuit detector includes the first transistor M1, a second transistor M2', a third transistor M3', the fourth transistor M4, and the fifth transistor M5.

The first transistor M1 is turned on based on a voltage of the first voltage source V1 or a voltage of the third voltage source V3. The first transistor M1 is turned off based on a voltage of the second voltage source V2. The voltage levels of the first voltage source V1 and the third voltage source V3 correspond to a voltage capable of fully turning on the first transistor M1. The voltage level of the second voltage source V2 corresponds to a voltage capable of fully turning off the first transistor M1.

The second transistor M2' and the third transistor M3' are of different types having opposite states in response to a short-circuit test signal ST_EN'. In some exemplary embodiments, the second transistor M2' may be an NMOS transistor and the third transistor M3' may be a PMOS transistor. The second transistor M2' is turned on in the display driving period and the third transistor M3' is turned on in the detection period.

The fourth transistor M4 transfers a voltage of the second voltage source V2 to the first node N1, that is, the gate electrode of the first transistor M1, based on the voltage of the third node N3. When the fourth transistor M4 is turned on, the first transistor M1 is turned off and the supply of the data voltage VDATA to the pixel is interrupted.

The fifth transistor M5 transfers the voltage of the third voltage source V3 to the first node N1, that is, the gate electrode of the first transistor M1, based on the voltage of the third node N3. When the fifth transistor M5 is turned on, the first transistor M1 is turned on to supply the data voltage VDATA to the pixel and/or the data voltage VDATA to the third node N3 through the second node N2.

Figure 10:
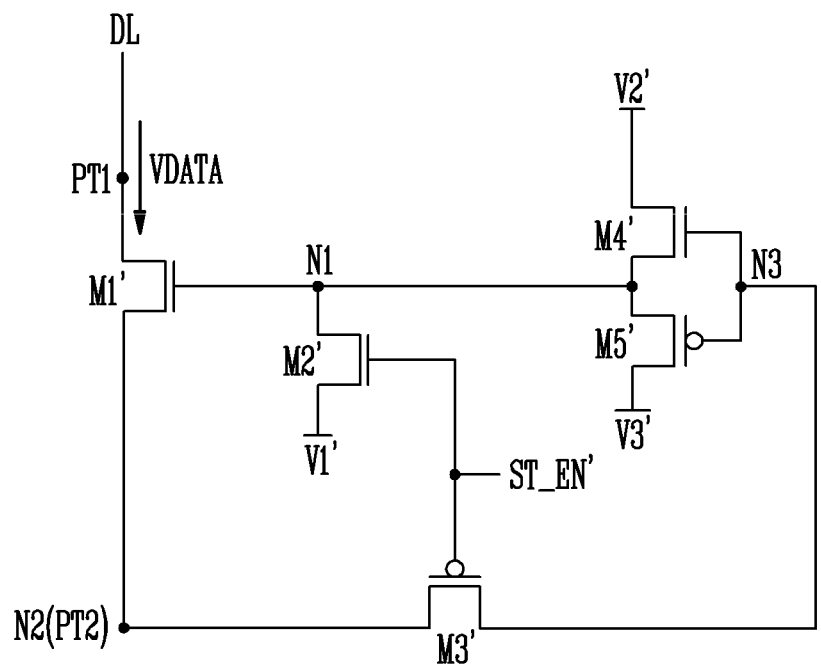
FIG. 10 is a circuit diagram illustrating an example of the short circuit detector of FIG. 2.

FIG. 10 is a circuit diagram illustrating an example of the short circuit detector of FIG. 2.

The short circuit detector of the present exemplary embodiment is substantially the same as the short circuit detector explained with reference to FIG. 2 except for types of the first to fifth transistors. Thus, the same reference numerals will be used to refer to the same or like parts as those described in the exemplary embodiment of FIG. 2, and any repetitive explanation concerning the above elements will be omitted.

Referring to FIG. 10, the short circuit detector includes the first transistor M1', the second transistor M2', the third transistor M3', the fourth transistor M4', and the fifth transistor M5'.

The first transistor M1' is turned on based on a voltage of the first voltage source V1' or a voltage of the second voltage source V2'. The first transistor M1' is turned off based on a voltage of the third voltage source V3'. The voltage levels of the first voltage source V1' and the second voltage source V2' correspond to a voltage capable of fully turning on the first transistor M1'. The voltage level of the third voltage source V3' corresponds to a voltage capable of fully turning off the first transistor M1'.

Since configurations and operations of the first to fifth transistors M1' to M5' are described above referred to FIGS. 8 and 9, duplicate descriptions will not be repeated.

Figure 11:
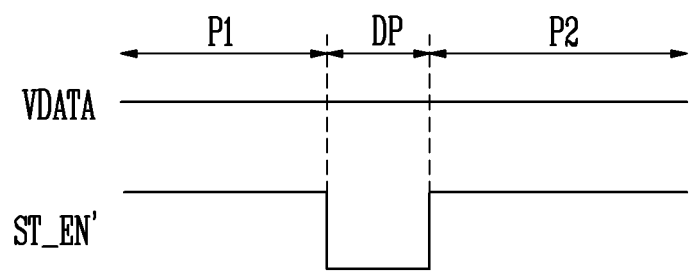
FIG. 11 is a timing diagram illustrating an example of a short-circuit test signal provided to the short circuit detectors of FIGS. 9 and 10.

FIG. 11 is a timing diagram illustrating an example of a short-circuit test signal provided to the short circuit detectors of FIGS. 9 and 10.

Referring to FIGS. 9 to 11, the short circuit detector of FIGS. 9 and 10 performs the short-circuit detection for the data line DL (or target data line) in response to the short-circuit test signal ST_EN'.

The second transistor M2' may be an NMOS transistor and the third transistor M3' may be a PMOS transistor.

The short-circuit test signal ST_EN' is enabled during the detection period DP. For example, the short-circuit test signal ST_EN' may have a logic low level during the detection period DP and may have a logic high level during other periods (for example, P1 and P2 periods). The third transistor M3' may be turned on to perform the short-circuit detection in the detection period DP. Since the operations of the short circuit detector are described above referred to FIGS. 3 and 4C, duplicate descriptions will not be repeated.

As described above, the short circuit detector and the display device having the same according to exemplary embodiments may detect defects, such as short-circuiting of the data lines, and cut off the electrical connection between the target data line and the pixels, by a simple transistor connection structure and a simple control method using the short-circuit test signal ST_EN. Therefore, it is possible to prevent damage to the display panel, complete display failure, and other malfunctions of the display device due to the occurrence of current overload by a relatively simple short circuit detector structure with a small cost burden.

The present exemplary embodiments may be applied to any display device and any system including the display device. For example, the present exemplary embodiments may be applied to a television, a computer monitor, a laptop, a digital camera, a cellular phone, a smart phone, a smart pad, a personal digital assistant (PDA), a portable multimedia player (PMP), a MP3 player, a navigation system, a game console, a video phone, etc.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A short circuit detector, comprising:
    a first transistor connected between a first portion of a data line and a second portion of the data line and comprising a gate electrode connected to a first node;
    a second transistor connected between a first voltage source and the first node and comprising a gate electrode configured to receive a short-circuit test signal;
    a third transistor connected between a second node included in the second portion of the data line and a third node and comprising a gate electrode configured to receive the short-circuit test signal;
    a fourth transistor connected between a second voltage source and the first node and comprising a gate electrode connected to the third node; and
    a fifth transistor connected to the first node and a third voltage source and comprising a gate electrode connected to the third node in common with the gate electrode of the third transistor.

2. The short circuit detector of claim 1, wherein the second transistor and the third transistor are of different types having opposite states in response to the short-circuit test signal.

3. The short circuit detector of claim 2, wherein:
the third transistor is turned on in an enable period of the short-circuit test signal; and
the second transistor has a turn-off state in the enable period of the short-circuit test signal.

4. The short circuit detector of claim 2, wherein:
each of the first and second transistors has a turn-on state in a disable period of the short-circuit test signal; and
the third transistor has a turn-off state in the disable period of the short-circuit test signal.

5. The short circuit detector of claim 4, wherein a voltage of the first voltage source corresponds to a voltage level that is sufficient to turn on the first transistor.

6. The short circuit detector of claim 4, wherein the first portion and the second portion of the data line are electrically connected to each other in the disable period of the short-circuit test signal.

7. The short circuit detector of claim 2, wherein the fourth transistor and the fifth transistor are of different types having opposite states in response to a voltage of the third node.

8. The short circuit detector of claim 7, wherein the first transistor is the same type as the fourth transistor.

9. The short circuit detector of claim 7, wherein the first transistor is turned off and the data line is opened when the fourth transistor is turned on.

10. The short circuit detector of claim 9, wherein a voltage of the second voltage source corresponds to a voltage level sufficient to turn off the first transistor.

11. The short circuit detector of claim 7, wherein the first transistor is turned on and the first portion and the second portion of the data line are electrically connected to each other, when the fifth transistor is turned on.

12. The short circuit detector of claim 11, wherein a voltage of the third voltage source corresponds to a voltage level sufficient to turn on the first transistor.

13. A display device, comprising:
a display panel comprising a plurality of pixels connected to a plurality of scan lines and a plurality of data lines, respectively;
a scan driver configured to supply a scan signal to each of the scan lines;
a data driver configured to supply a data voltage to each of the data lines;
a short circuit detector connecting a first portion and a second portion of a target data line among the data lines; and
a timing controller controlling the scan driver, the data driver, and the short circuit detector,
wherein:
the short circuit detector is configured to detect a short circuit of the target data line based on a short-circuit test signal; and
the short circuit detector comprises:
a first transistor connected between the first portion of the target data line and the second portion of the target data line and comprising a gate electrode connected to a first node;
a second transistor connected between a first voltage source and the first node and comprising a gate electrode configured to receive the short-circuit test signal;
a third transistor connected between a second node included in the second portion of the target data line and a third node and comprising a gate electrode configured to receive the short-circuit test signal;
a fourth transistor connected between a second voltage source and the first node and comprising a gate electrode connected to the third node; and
a fifth transistor connected to the first node and a third voltage source and comprising a gate electrode connected to the third node in common with the gate electrode of the third transistor.

14. The display device of claim 13, wherein target data lines correspond to predetermined parts of the total data lines, and the short circuit detector is connected to the target data lines.

15. The display device of claim 13, wherein:
the second transistor and the third transistor are different types having opposite states in response to the short-circuit test signal;
the fourth transistor and the fifth transistor are different types having opposite states in response to a voltage of the third node; and
the first transistor and the fourth transistor are the same type.

16. The display device of claim 13, wherein:
the display panel comprises a display area in which the pixels are arranged and a peripheral area in which the data driver and the scan driver are arranged outside the display area; and
the short circuit detector is disposed between the display area and the data driver on the display panel.

17. The display device of claim 13, wherein the short circuit detector is integrated in the data driver.

18. A display device, comprising:
a display panel comprising a plurality of pixels connected to a plurality of scan lines and a plurality of data lines, respectively;
a scan driver configured to supply a scan signal to each of the scan lines;
a data driver configured to supply a data voltage to each of the data lines;
a short circuit detector connecting a first portion and a second portion of a target data line among the data lines; and
a timing controller controlling the scan driver, the data driver, and the short circuit detector,
wherein:
the short circuit detector is configured to detect a short circuit of the target data line based on a short-circuit test signal; and
the short circuit detector comprises:
a plurality of first transistors each connected between the first portion and the second portion of each of a plurality of target data lines and controlled in common based on a voltage of the first node;
a second transistor connected between a first voltage source and the first node and comprising a gate electrode configured to turn on all the first transistors;
a plurality of third transistors each connected between the second portion of the target data line and a common node and each comprising a gate electrode configured to receive the short-circuit test signal;
a fourth transistor connected to a second voltage source and the first node and comprising a gate electrode connected to the common node; and
a fifth transistor connected to the first node and a third voltage source and comprising a gate electrode connected to the third node in common with the gate electrode of the third transistor.

19. The display device of claim 18, wherein the second transistor maintains a turn-off state and the third transistors are sequentially turned on during a detection period in which a short-circuit detection is performed.

\* \* \* \* \*